(12) United States Patent
Asamura et al.

(10) Patent No.: US 7,157,981 B2
(45) Date of Patent: Jan. 2, 2007

(54) SURFACE-MOUNTED OSCILLATOR

(75) Inventors: Fumio Asamura, Sayama (JP); Kuichi Kubo, Sayama (JP); Kozo Ono, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/897,977

(22) Filed: Jul. 22, 2004

(65) Prior Publication Data

US 2005/0017811 A1    Jan. 27, 2005

(30) Foreign Application Priority Data

Jul. 24, 2003    (JP)    ............... 2003-279446

(51) Int. Cl.
 *H03B 5/12*    (2006.01)
(52) U.S. Cl. .............. 331/108 C; 331/158; 331/116 R; 331/116 FE; 331/107 A
(58) Field of Classification Search ............ 331/107 A, 331/158, 116 R, 108 C, 116 FE
See application file for complete search history.

(56) References Cited

U.S. PATENT DOCUMENTS

| | | | | |
|---|---|---|---|---|
| 5,500,628 A | 3/1996 | Knecht | ........................ | 331/68 |
| 6,456,168 B1 * | 9/2002 | Luff | ........................... | 331/68 |
| 6,759,913 B1 * | 7/2004 | Biernacki | .................... | 331/68 |

FOREIGN PATENT DOCUMENTS

| | | |
|---|---|---|
| JP | 8-204452 | 8/1996 |
| JP | 09-298440 | 11/1997 |
| JP | 2000244243 A | 9/2000 |
| JP | 2003179433 A | 6/2003 |

* cited by examiner

*Primary Examiner*—Arnold Kinkead
(74) *Attorney, Agent, or Firm*—Greers, Burns & Crain, Ltd

(57)    ABSTRACT

A surface-mounted oscillator configured by integrally accommodating an oscillation element, an IC chip, and a circuit element in a surface-mounted package is characterized in that the oscillation element, the IC chip, and the circuit element are arranged in positions in a direction vertical to a mounting surface of the surface-mounted oscillator. The oscillation element may be an oscillation element using bulk wave oscillation, or an oscillation element using surface wave oscillation.

4 Claims, 9 Drawing Sheets

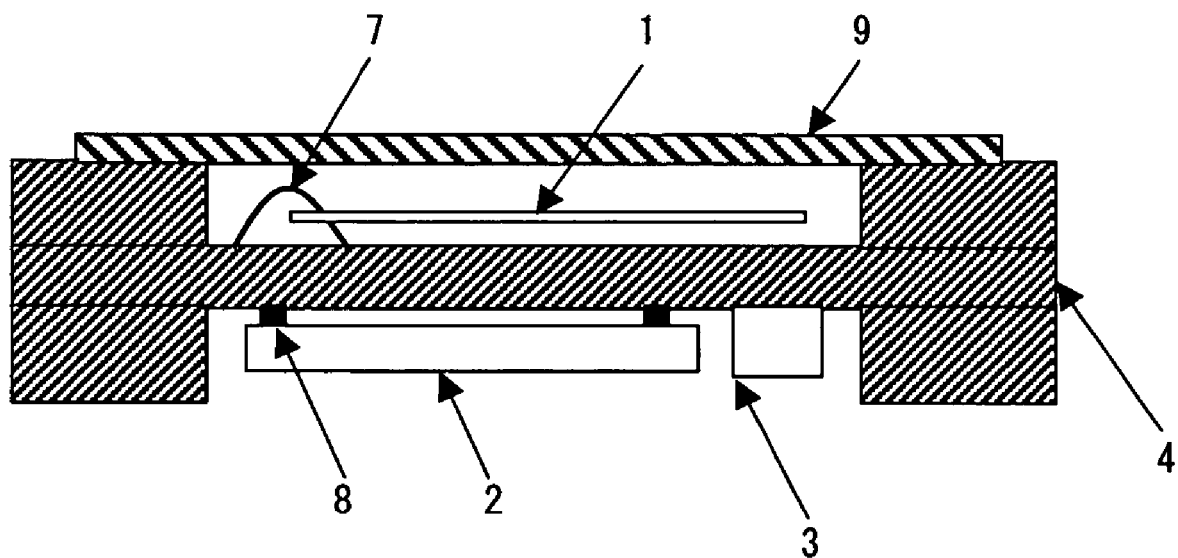
F I G. 1

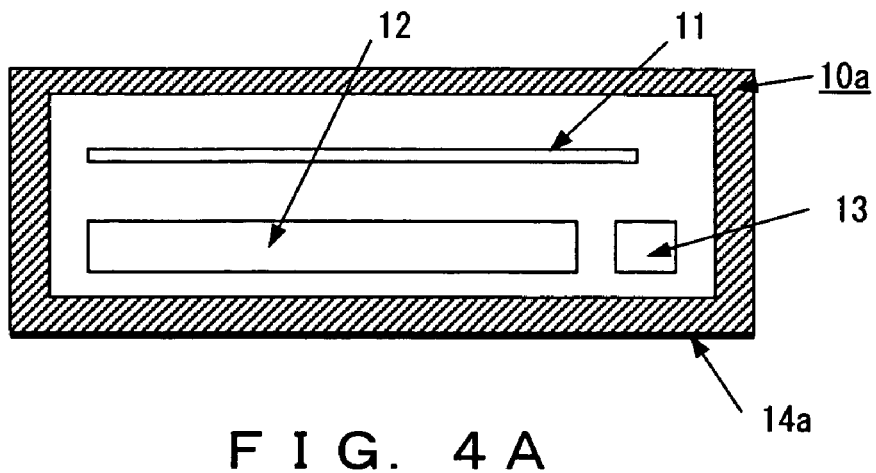
F I G. 4A
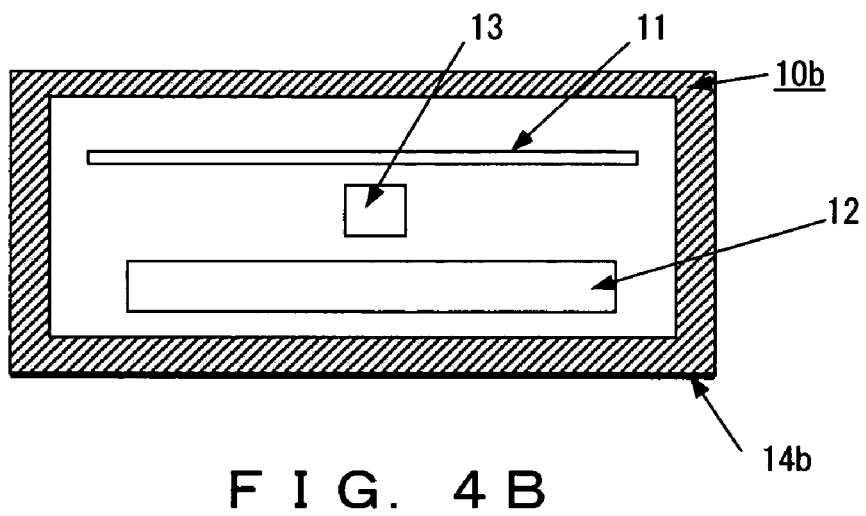
F I G. 4B
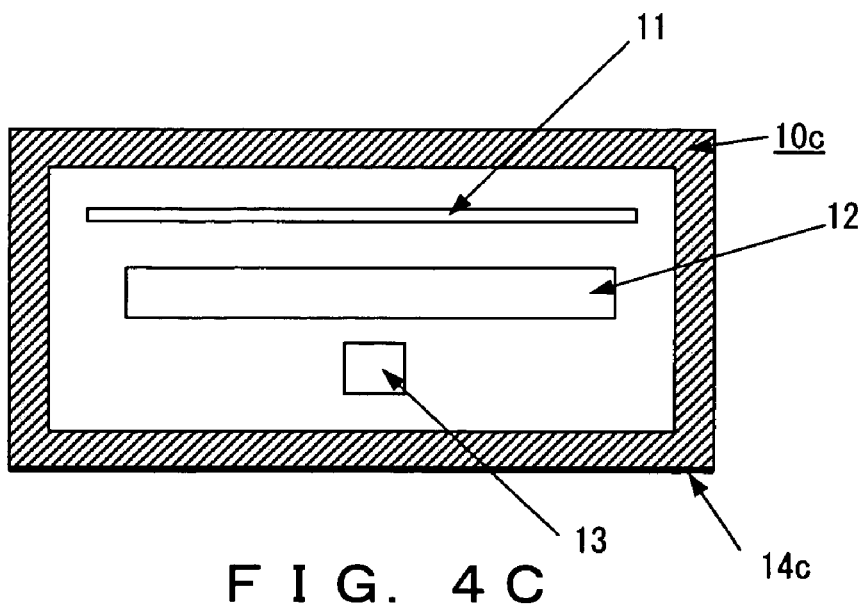
F I G. 4C

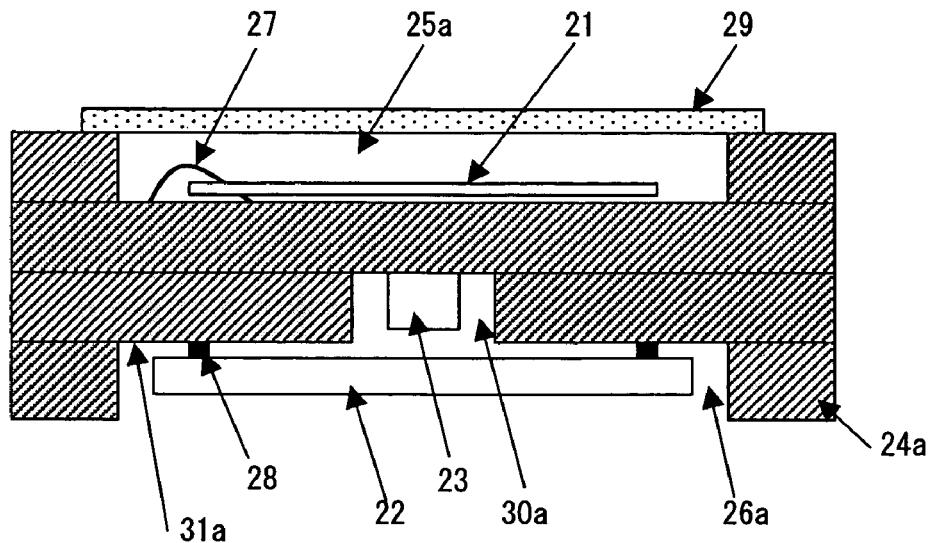
F I G. 5 A
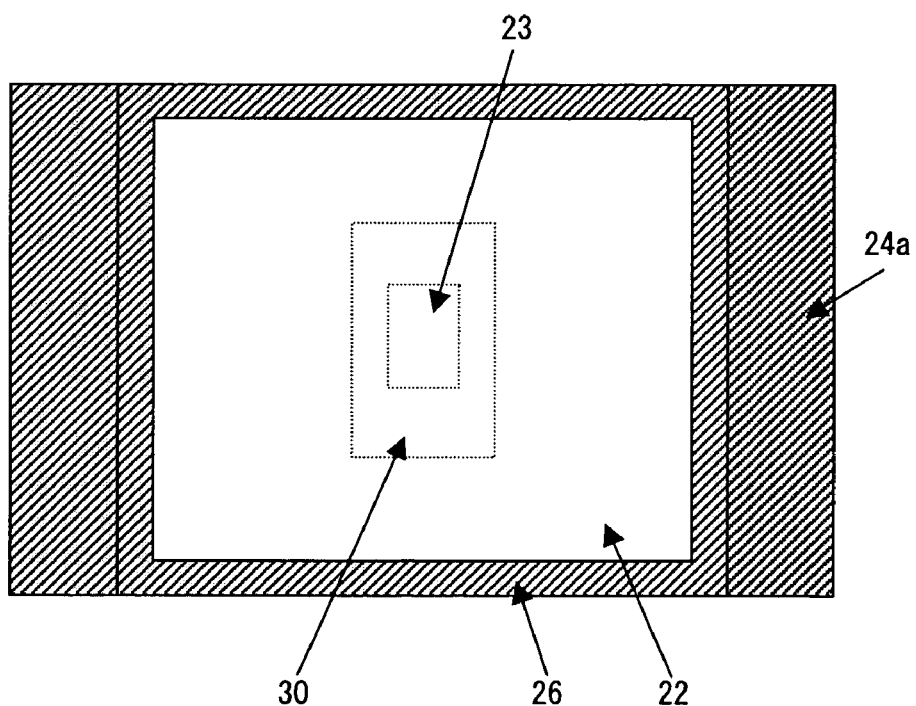
F I G. 5 B

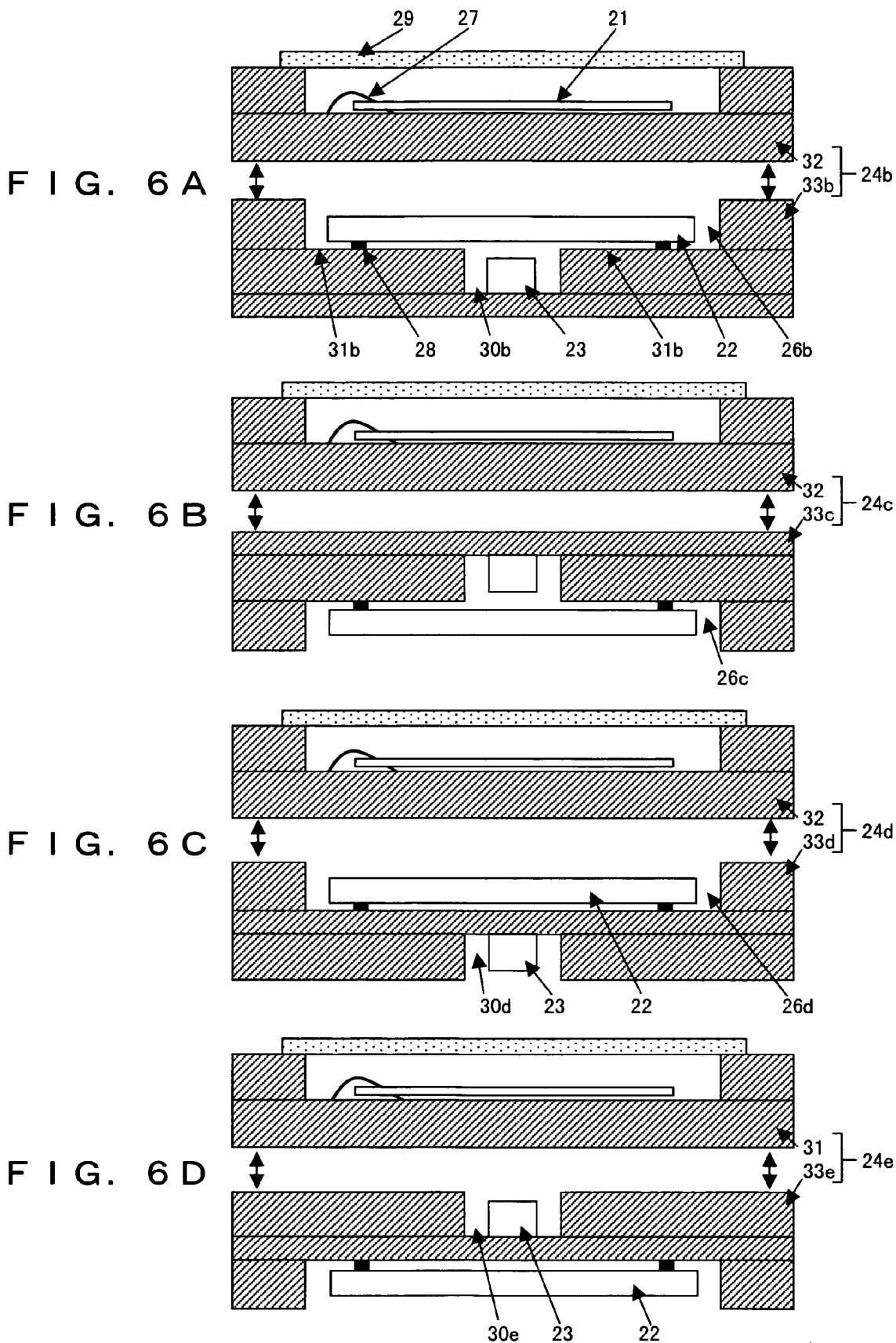

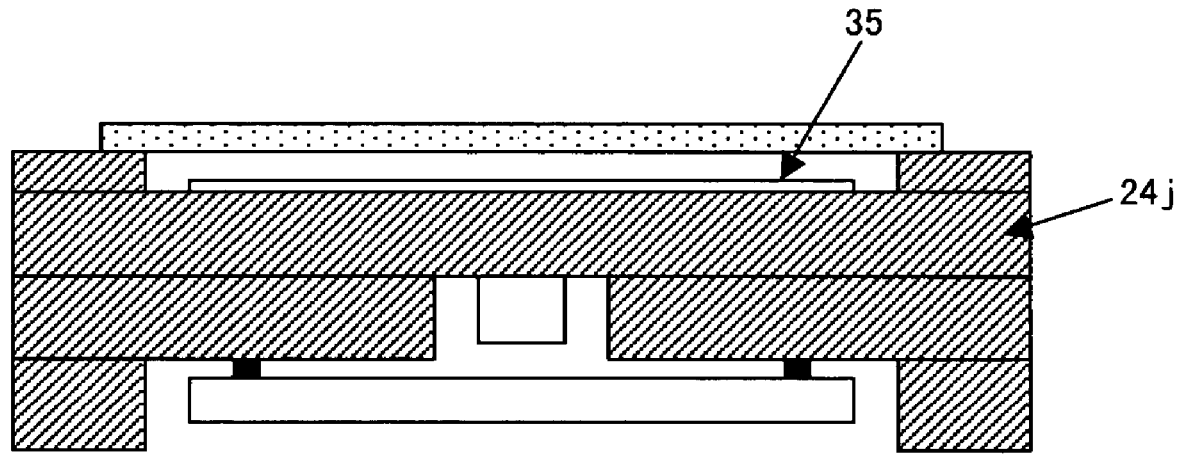
F I G. 9

SURFACE-MOUNTED OSCILLATOR

BACKGROUND OF THE INVENTION

1. Field of the Invention

The present invention relates to a surface-mounted oscillator, and more particularly, to a technique for reducing the planar dimensions of the surface-mounted oscillator.

2. Description of the Related Art

Since a surface-mounted oscillator is small-sized and lightweight, it is, for example, included in a portable appliance, and widely used as a frequency or time reference source, etc. For example, if a portable appliance to be used is a telephone, a temperature compensated oscillator (TCXO) disclosed by Patent Document 1 is used because of its dynamic environments.

A surface-mounted oscillator is configured to accommodate, in a surface-mounted package, an oscillation element such as a crystal piece, etc., an IC (Integrated Circuit) chip in which an oscillation circuit, a temperature compensation circuit, etc., are integrated, and a circuit element composed as a discrete component such as a capacitor, etc., which cannot be integrated within the IC chip.

FIGS. 1 to 3 are cross-sectional views showing the internal configurations of normal surface-mounted oscillators.

FIG. 1 shows a surface-mounted oscillator recited in Patent Document 2. In this oscillator, an oscillation element 1, an IC chip 2, and a circuit element 3 composed as a discrete component such as a capacitor, etc. are integrally accommodated in a surface-mounted package 4 of a so-called H structure type.

The surface-mounted package 4 is configured by comprising concave portions on both of its main surfaces, and by integrating an oscillation element 1, which is sealed with a cover 9 after being accommodated in the concave portion on one of the main surfaces, and the IC chip 2 and the circuit element 3, which are accommodated in the other concave portion.

FIG. 2 shows a surface-mounted oscillator recited in Patent Document 3. The surface-mounted oscillator shown in this figure has a configuration of a junction type, where a surface-mounted package 4 is separated into a package 5 and a mounting board 6, and the concave mounting board 6 in which an IC chip 2 and a circuit element 3 are accommodated is joined to the bottom of a crystal oscillator configured by hermetically sealing an oscillation element 1 with a cover after accommodating the oscillation element 1 in the package 5.

FIG. 3 shows a surface-mounted oscillator recited in Patent Document 4. The surface-mounted oscillator shown in this figure has a configuration of a single space type, where an IC chip 2, a circuit element 3, and an oscillation element 1 are hermetically sealed with a cover 9 in the same space after the IC chip 2 and the circuit element 3, and one end of the oscillation element 1 are respectively secured to the bottom of a concave portion of a surface-mounted package 4, and to a stage portion on an inner wall of the concave portion in the surface-mounted package 4.

[Patent Document 1]

Japanese Patent Publication No. 2000-244243

[Patent Document 2]

Japanese Patent Publication No. HEI8-204452

[Patent Document 3]

Japanese Patent Publication No. 2003-179433

[Patent Document 4]

Japanese Patent Publication No. HEI9-298440

Currently, the planar dimensions of a surface-mounted oscillator are, for example, on the order of 3.2 by 2.5 mm, but there is a demand for further reducing the dimensions. Additionally, as an oscillation frequency increases, the size of an oscillation element 1 such as a crystal piece, etc. becomes smaller. However, there is a problem that an increase in planar dimensions cannot be avoided, because an IC chip, and a discrete component such as a capacitor, etc. are arranged on the same flat surface.

SUMMARY OF THE INVENTION

An object of the present invention is to provide a surface-mounted oscillator, the planar dimensions of which can be reduced, and which accommodates an oscillation element, an IC chip, and a circuit element (discrete component).

The present invention assumes a surface-mounted oscillator configured by integrally accommodating an oscillation element, an IC chip, and a circuit element in a surface-mounted package, and is characterized in that the oscillation element, the IC chip, and the circuit element are arranged in positions in a direction vertical to a mounting surface of the surface-mounted oscillator.

The surface-mounted package may be configured to comprise a first concave portion that accommodates the oscillation element on a first main surface, and a second concave portion that accommodates the IC chip and the circuit element on a second main surface as opposed to the first main surface.

Or, the surface-mounted package may be configured by joining a first package that accommodates the oscillation element, and a second package that accommodates the IC chip and the circuit element.

Or, the surface-mounted package maybe configured to comprise a concave portion that accommodates the oscillation element, the IC chip, and the circuit element.

Or, the oscillation element may be an oscillation element using bulk wave oscillation, which entirely oscillates, or an oscillation element using surface wave oscillation, only the surface of which oscillates.

According to the present invention, the oscillation element, the IC chip, and the circuit element are arranged in positions in a vertical direction, whereby the planar dimensions of the surface-mounted oscillator can be reduced.

BRIEF DESCRIPTION OF THE DRAWINGS

FIG. 1 is a cross-sectional view showing a first example of a conventional surface-mounted oscillator;

FIG. 4A is a conceptual schematic showing an arrangement of constituent elements in a conventional surface-mounted oscillator;

FIGS. 4B and 4C are conceptual schematics respectively showing an arrangement of constituent elements in a surface-mounted oscillator according to the present invention;

FIG. 5A is a cross-sectional view showing a surface-mounted oscillator according to a first preferred embodiment;

FIG. 5B shows its bottom view;

FIGS. 6A, 6B, 6C, and 6D are cross-sectional views respectively showing a surface-mounted oscillator according to a second preferred embodiment;

FIG. 9 is a schematic showing a configuration where a SAW is used as an oscillation element.

DESCRIPTION OF THE PREFERRED EMBODIMENTS

Fundamental principle of the present invention is first described.

Figure 2:
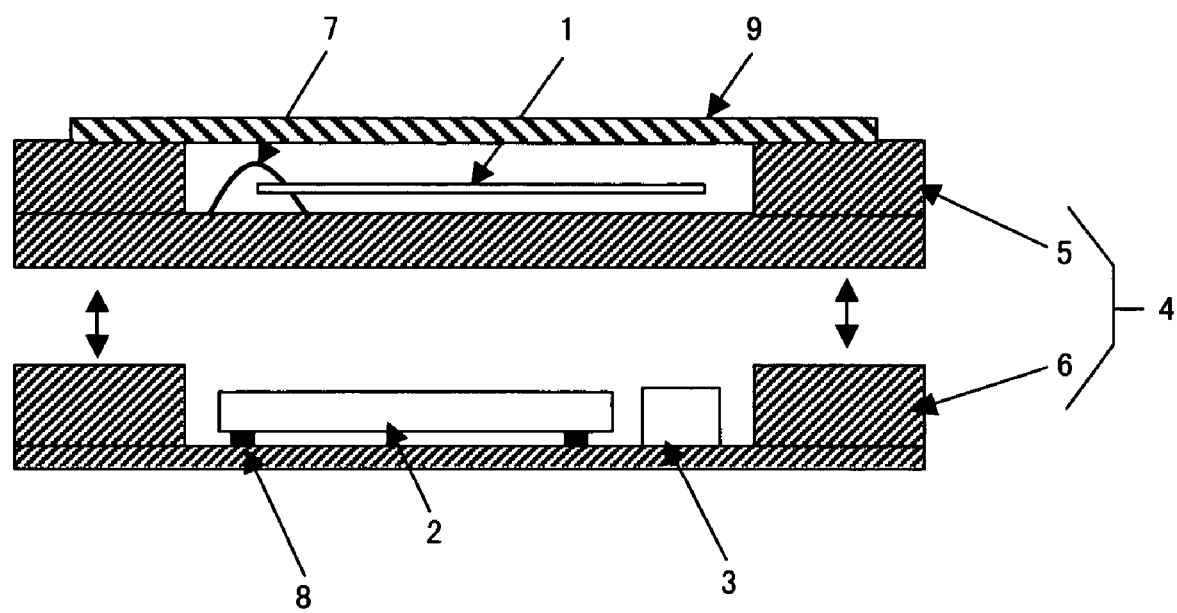
FIG. 2 is a cross-sectional view showing a second example of a conventional surface-mounted oscillator.
Figure 3:
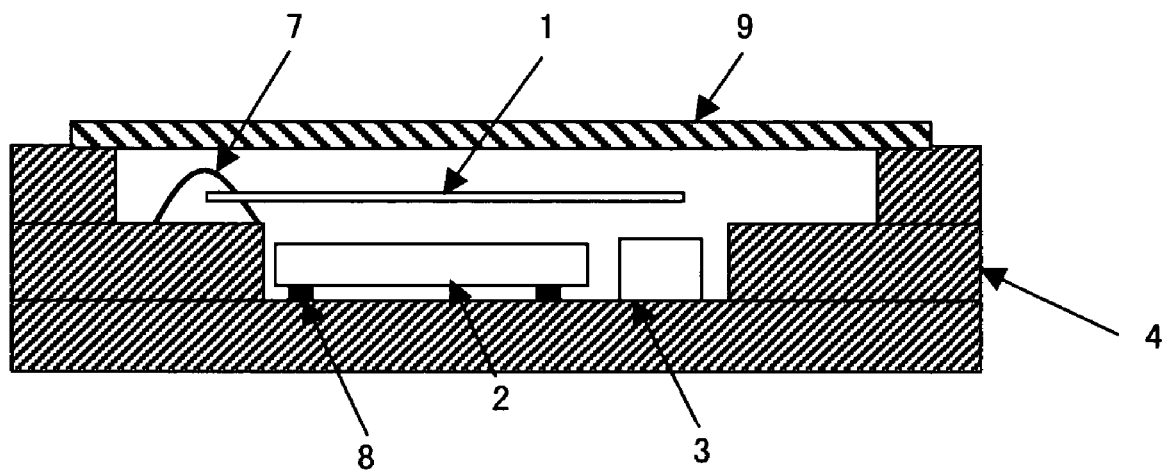
FIG. 3 is a cross-sectional view showing a third example of a conventional surface-mounted oscillator.

FIG. 4A is a conceptual schematic showing the arrangement of constituent elements in the conventional surface-mounted oscillators shown in FIGS. 1 to 3.

In the conventional surface-mounted oscillators, an IC chip 12, and a circuit element 13 composed of a discrete component such as a capacitor, etc. are accommodated by being arranged in a package 10a in a direction horizontal to a mounting surface 14a comprising mounting electrodes not shown.

With an increase in output frequency demanded for a surface-mounted oscillator in recent years, the size of an oscillation element 11 has been decreasing. Additionally, in a temperature compensated oscillator, etc., an IC chip 12 also includes a temperature compensation circuit, etc. Therefore, its size is approximately the same as that of an oscillation element 11 composed of a crystal piece. Accordingly, the planar dimensions of a conventional surface-mounted oscillator are determined by a size obtained by combining areas where the IC chip 12 and the circuit element 13 are respectively mounted.

Considering this point, in a surface-mounted oscillator according to the present invention, respective constituent elements are arranged in positions in a vertical direction.

FIGS. 4B and 4C are conceptual schematics respectively showing an arrangement of constituent elements in the surface-mounted oscillator according to the present invention. In FIG. 4B, an oscillation element 11, a circuit element 13, and an IC chip 12 are accommodated in a package 10b in this order in a direction vertical to a mounting surface 14b. In the meantime, in FIG. 4C, an oscillation element 11, an IC chip 12, and a circuit element 13 are accommodated in a package 10c in order more apart from a mounting surface 14c.

The circuit element 13 is smaller than the oscillation element 11 and the IC chip 12. Therefore, in the case of the configuration shown in FIG. 4B or 4C, the planar dimensions of the surface-mounted oscillator 10 are determined by a larger one of the areas where the oscillation element 11 and the IC chip 12 are respectively mounted. Accordingly, the planar dimensions of the oscillator can be reduced in comparison with the conventional surface-mounted oscillator which is shown in FIG. 4A, and determined by the combined area where the IC chip 12 and the circuit elements 13 are mounted.

A temperature compensated oscillator using a multilayer ceramic package is exemplified next as a specific configuration example of the surface-mounted oscillator according to the present invention.

FIG. 5A is a cross-sectional view showing a surface-mounted oscillator according to a first preferred embodiment, whereas FIG. 5B shows its bottom view. The configuration shown in FIG. 5 corresponds to the configuration shown in FIG. 1, where the surface-mounted package of a so-called structure type is used.

The surface-mounted oscillator shown in FIG. 5A and 5B are configured by accommodating an oscillation element 21 such as a crystal piece, etc., an IC chip 22, and a circuit element 23 such as a capacitor, etc. in a surface-mounted package 24a made of multilayer ceramic. In FIG. 5A, the bottom portion is the mounting surface.

The oscillation element 21 is made of a piezoelectric material such as a crystal piece, etc., and has excitation electrodes not shown on both of main surfaces. For example, drawn electrodes are extended, for example, to both sides of one end of the oscillation element 21. The IC chip 22 is implemented by integrating circuit elements that configure an oscillation circuit having a temperature compensation mechanism not shown. The circuit element 23 is a circuit element that cannot be integrated within the IC chip 22, such as a capacitor used, for example, to form with a resistor a lowpass filter, which removes noise caused by the temperature compensation mechanism, a bypass capacitor which makes a high-frequency component pass through, an inductor used to widen the variable width of a frequency in a voltage controlled oscillator (VCO), and the like. Since the capacitor that forms a lowpass filter requires a large capacity equal to or higher than 1000 pF, it cannot be integrated within the IC chip 22. Accordingly, the capacitor is used as a discrete component. Also the bypass capacitor between a power source and a ground cannot be integrated within the IC chip 22 due to its large capacity. Therefore, the bypass capacitor is used as a discrete component.

In the configuration shown in FIG. 5, a hole 30a is further provided in the central region of a concave portion 26a that accommodates the IC chip 22 in the surface-mounted package 24a of a so-called H structure type having the main surfaces on both of which the concave portions 25a and 26a are respectively provided. After the oscillation element 21 is secured to the concave portion 25a, in which the hole 30a is not provided, for example, with a conducting adhesive 27, it is hermetically sealed by seam-welding a cover 29. The circuit element 23 is then accommodated by being secured to the hole 30a, which exists in the other concave portion 26a, with a conducting adhesive or soldering, and the IC chip 22 is secured to stage portions 31a of the concave portion 26a with flip chip bonding using bumps 28 to cover the circuit element 23. The surface-mounted package 24a is made of multilayer ceramic, and each of the concave portions 25a and 26a, and the hole 30a are formed by multilayer ceramic.

With such a configuration, in the surface-mounted oscillator shown in FIG. 5, the oscillation element 21, the IC chip 22, and the circuit element 23 are three-dimensionally arranged in the vertical direction, whereby the mounting area of the surface-mounted oscillator can be reduced.

Note that opposed two sides of the concave portion 26a, which accommodates the IC chip 22, are made open to increase the mounting area of the IC chip 22. If the IC chip 22 is small, the concave portion 26a can be also configured as a concave portion composed of 4 sides without making the two sides open, as a matter of course.

A second preferred embodiment is described next.

FIGS. 6A, 6B, 6C, and 6D are cross-sectional views respectively showing a surface-mounted oscillator according to a second preferred embodiment. The configurations shown in FIG. 6 correspond to the configuration of a junction type, which is shown in FIG. 2. In FIG. 6, the fundamentally same constituent elements as those in the first preferred embodiment are denoted with the same reference numerals, and their descriptions are omitted or briefly provided.

The surface-mounted oscillator shown in FIG. 6A is configured by separating a surface-mounted package 24b into a package 32 in which an oscillation element 21 is sealed, and a mounting board 33b on which an IC chip 22, and a circuit element 23 such as a capacitor, etc. are mounted. The mounting board 33 is bonded to the bottom of the oscillation element, which is configured by securing the oscillation element 21 to the package 32, for example, with a conducting adhesive 27, and by hermetically sealing the oscillation element 21 with a cover 29.

A concave portion 26b is provided on the mounting board 33b, and a hole 30b is provided in the central region of the concave portion 26b. The circuit element 23 is accommodated in the hole 30b, and the IC chip 22 is secured to stage portions 31b in the concave portion 26b with flip chip bonding using bumps 28 to cover the circuit element 23.

Then, the side of the concave portion 26b of the mounting board 33b and the side of the bottom of the package 32 are joined with soldering.

In the configuration shown in FIG. 6A, the mounting board 33b may be configured upside down. FIG. 6B shows such a configuration.

In this figure, a surface-mounted package 24c is composed of the same package 32 as that in FIG. 6A, and a mounting board 33c configured by turning the mounting board 33b upside down, and is configured by bonding the bottom of the package 32 and a surface opposite to a surface having a concave portion 26c of the mounting board 33c.

Additionally, FIG. 6C shows a configuration where a mounting board 33d having a concave portion and a hole on different surfaces is bonded to the bottom of a crystal oscillator configured by the same package 32 as that in FIG. 6A.

In FIG. 6C, the mounting board 33d has a concave portion 26d, which accommodates the IC chip 22, on one of two opposed main surfaces, and also has a hole 30d, which accommodates a circuit element 23, on the other main surface. The IC chip 22, and the circuit element 23 composed of a discrete component are respectively accommodated in the concave portion 26d, and in the hole 30d, and integrated. Then, the main surface having the concave portion 26d is joined to the bottom of the package 32.

Also in the configuration shown in FIG. 6C, the mounting board 33d may be configured upside down. FIG. 6D shows such a configuration.

In this figure, a surface-mounted package 24e is configured by the same package 32 as that in FIG. 6A, and a mounting board 33e implemented by turning the mounting board 33d upside down, and is also configured by joining the bottom of the package 32 and a main surface of the mounting board 33e, which has a hole 30e accommodating a circuit element 23.

In the cases of the configurations according to the second preferred embodiment shown in FIG. 6, only the package 32 is examined after the oscillation element 21 is sealed in the package 32, and only a passed package can be used to join to the mounting board 33. Accordingly, expensive IC chip 22 and circuit element 23 can be prevented from being wasted.

A third preferred embodiment is described next.

Figure 7A:
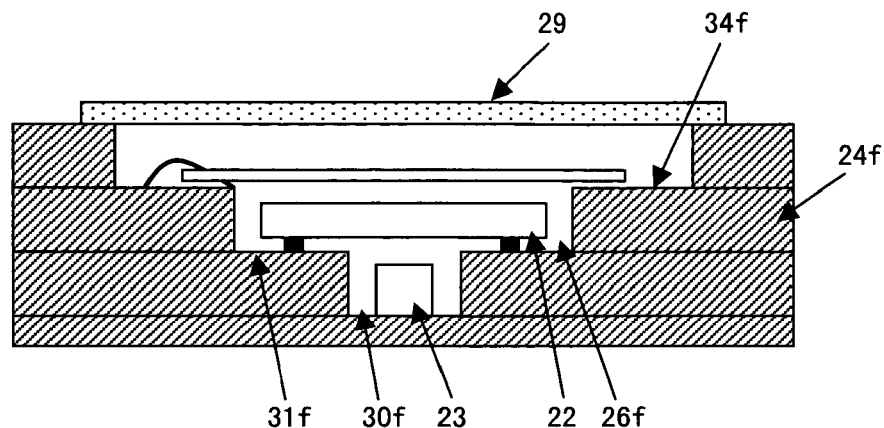
FIGS. 7A, 7B, and 7C are cross-sectional views respectively showing a surface-mounted oscillator according to a third preferred embodiment.
Figure 7B:
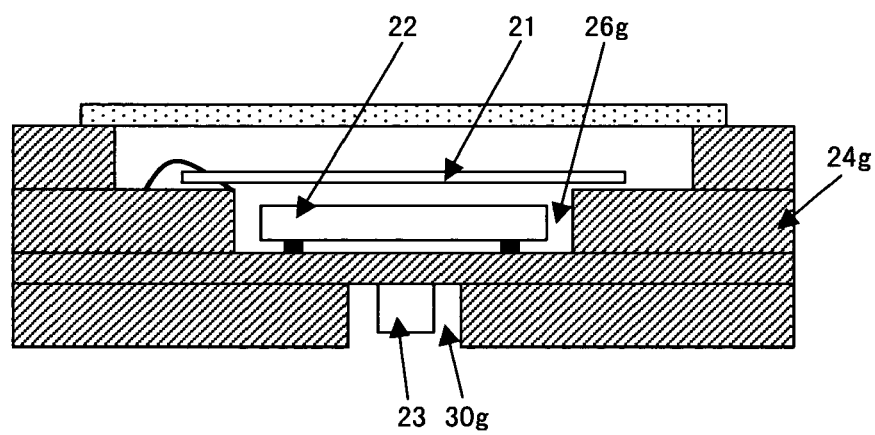
Figure 7C:
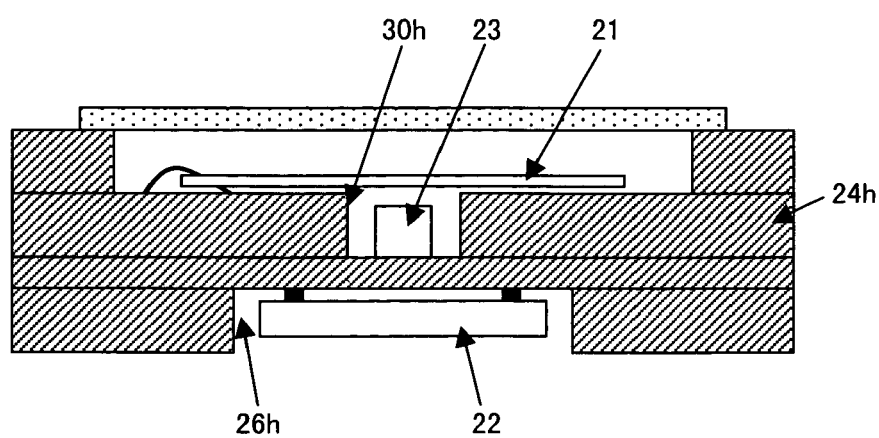

FIGS. 7A, 7B, and 7C are cross-sectional views respectively showing a surface-mounted oscillator according to a third preferred embodiment. The configurations in FIG. 7 correspond to the configuration of a single space type, which is shown in FIG. 3. In FIG. 7, the fundamentally same constituent elements as those in the first and the second preferred embodiments shown in FIGS. 5 and 6 are denoted with the same reference numerals, and their descriptions are omitted or briefly provided.

The configuration according to the third preferred embodiment is a configuration where an oscillation element 21 such as a crystal piece, etc., and other constituent elements are sealed in the same space.

In FIG. 7A, in a surface-mounted oscillator, an oscillation element 21 such as a crystal piece, etc., an IC chip 22, and a circuit element 23 such as a capacitor, etc. are accommodated in a surface-mounted package 24f.

The surface-mounted package 24f comprises stage portions 34f, and a concave portion 26f on an inner wall. Additionally, a hole 30f is provided in the central region of the bottom of the concave portion 26f.

The circuit element 23 such as a capacitor, etc. is accommodated in the hole 30f, and the IC chip 22 is secured to the stage portions 31f within the concave portion 26f to cover the circuit element 23. Additionally, after the oscillation element 21 is accommodated to cover the IC chip 22, for example, by securing one end of the oscillation element 21 to a stage portion 34f on the inner wall, it is sealed with a cover 29.

FIGS. 7B and 7C respectively show a modified oscillator of a single space type.

In FIG. 7B, only an IC chip 22 is accommodated in a concave portion 26g provided in the same space as that accommodating an oscillation element 21, and a circuit element 23 is accommodated in a hole 30g provided on an opposite main surface of a surface-mounted package 24g. In FIG. 7C, inversely, only a circuit element 23 is accommodated in a hole 30h provided in the same space as that accommodating an oscillation element 21, and an IC chip 22 is accommodated in a concave portion 26h provided on an opposite main surface of a surface-mounted package 24h.

The first to the third preferred embodiments described up to this point refer to the cases where only one circuit element 23 such as a capacitor, etc. exists. However, a plurality of circuit elements 23 can be similarly accommodated also in the case of a configuration where an oscillator uses the plurality of circuit elements 23.

Figure 8:
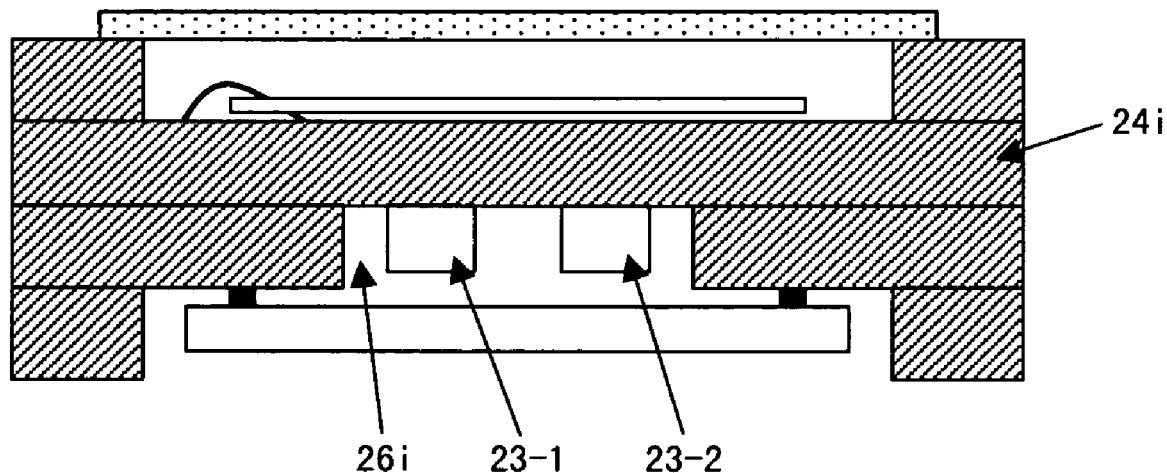
FIG. 8 is a schematic exemplifying a case where the surface-mounted oscillator comprises a plurality of circuit elements composed of discrete components.

FIG. 8 shows a case where plurality of circuit elements 23 are accommodated in the surface-mounted oscillator shown in FIG. 5.

Normally, the size of a circuit element 23 is much smaller than an oscillation element 21 and an IC chip 22. Accordingly, as shown in FIG. 8, a hole 26i having a space, in which a plurality of circuit elements 23 can be mounted within a mounting area of an oscillation element 21 or an IC chip 22 as shown in FIG. 8, can be provided, and the plurality of circuit elements can be accommodated in the hole 26i.

In this figure, the hole 26i in which the plurality of circuit elements 23 can be mounted is provided in the center of a concave portion 26 accommodating the IC chip 22 in the surface-mounted package 24i, and the two circuit elements 23-1 and 23-2 are accommodated in this hole 26i. Also in the surface-mounted oscillators having the configurations according to the second and the third preferred embodiments, which are shown in FIGS. 6 and 7, a plurality of circuit elements 23 can be accommodated.

The above described embodiments refer to the cases where the crystal piece using bulk wave oscillation is used as the oscillation element 11. However, in the surface-mounted oscillators represented as the respective embodiments, an oscillation element using surface wave oscillation such as a SAW (Surface Acoustic Wave), etc. may be used as the oscillation element other than the element using bulk wave oscillation.

FIG. 9 shows a configuration where a SAW is used as an oscillation element in the surface-mounted oscillator shown in FIG. 5.

In this figure, the side of one main surface of an oscillation element 35 using a SAW, on which excitation electrodes are formed, is secured to the bottom of a concave portion of a surface-mounted package 24*j* with flip chip bonding using bumps not shown. Similarly, also in the surface-mounted oscillators having the configurations according to the second and the third preferred embodiments, which are shown in FIGS. 6 and 7, an oscillation element using surface wave oscillation such as a SAW, etc. can be used as the oscillation element.

At this time, the hermetic of the oscillation element using a SAW, etc. can be low in comparison with the oscillation element using bulk wave oscillation. Therefore, a resin may be available as the surface-mounted package 24*j* other than multilayer ceramic.

The above provided description refers to the configurations where the IC chip 22 is secured with flip chip bonding. However, the IC chip 22 may be connected with wire bonding.

Additionally, a resinous agent not shown may be added to protect the IC chip, and the circuit element 23 such as a capacitor, etc. on demand.

In the above described preferred embodiments, the oscillation element 21, the IC chip 22, and the circuit element 23 such as a capacitor, etc. are arranged in a vertical direction in all the cases, whereby the planar dimensions can be held small.

What is claimed is:

1. A surface-mounted oscillator configured by integrally accommodating an oscillation element, an IC chip, and a circuit element in a surface-mounted package, wherein the oscillation element, the IC chip, and the circuit element are arranged in positions in a direction vertical to a mounting surface of the surface-mounted oscillator, the surface-mounted package comprises a first concave portion that accommodates the oscillation element on a first main surface, and a second concave portion that accommodates the IC chip and the circuit element on a second main surface as opposed to the first main surface, and the second concave portion comprises a hole in which the circuit element is accommodated, and a stage portion to which the IC chip is secured.

2. A surface-mounted oscillator configured by integrally accommodating an oscillation element, an IC chip, and a circuit element in a surface-mounted package, wherein the oscillation element, the IC chip, and the circuit element are arranged in positions in a direction vertical to a mounting surface of the surface-mounted oscillator, the surface-mounted package is configured by joining a first package that accommodates the oscillation element, and a second package that accommodates the IC chip and the circuit element, and the second package comprises a concave portion that accommodates the IC chip, and a hole that accommodates the circuit element in the concave portion.

3. A surface-mounted oscillator configured by integrally accommodating an oscillation element, an IC chip, and a circuit element in a surface-mounted package, wherein the oscillation element, the IC chip, and the circuit element are arranged in positions in a direction vertical to a mounting surface of the surface-mounted oscillator, the surface-mounted package is configured by joining a first package that accommodates the oscillation element, and a second package that accommodates the IC chip and the circuit element, and the second package comprises a first main surface having a concave portion that accommodates the IC chip, and a second main surface, as opposed to the first main surface, having a hole that accommodates the circuit element.

4. A surface-mounted oscillator configured by integrally accommodating an oscillation element, an IC chip, and a circuit element in a surface-mounted package, wherein the oscillation element, the IC chip, and the circuit element are arranged in positions in a direction vertical to a mounting surface of the surface-mounted oscillator, the surface-mounted package comprises a concave portion that accommodates the oscillation element, the IC chip, and the circuit element, and the concave portion comprises a hole that accommodates the circuit element.

* * * * *